(12) United States Patent
Zang et al.

(10) Patent No.: US 9,735,152 B2
(45) Date of Patent: Aug. 15, 2017

(54) NON-PLANAR STRUCTURE WITH EXTENDED EXPOSED RAISED STRUCTURES AND SAME-LEVEL GATE AND SPACERS

(71) Applicant: GLOBALFOUNDRIES Inc., Grand Cayman (KY)

(72) Inventors: Hui Zang, Guilderland, NY (US); Bingwu Liu, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 155 days.

(21) Appl. No.: 14/315,602

(22) Filed: Jun. 26, 2014

(65) Prior Publication Data
US 2015/0380404 A1    Dec. 31, 2015

(51) Int. Cl.
*H01L 21/8234* (2006.01)
*H01L 27/088* (2006.01)
*H01L 29/66* (2006.01)
*H01L 29/06* (2006.01)

(52) U.S. Cl.
CPC ...... *H01L 27/0886* (2013.01); *H01L 29/6656* (2013.01); *H01L 29/6681* (2013.01); *H01L 21/823431* (2013.01)

(58) Field of Classification Search
CPC ......... H01L 21/823431; H01L 29/6656; H01L 29/6681
See application file for complete search history.

(56) References Cited

U.S. PATENT DOCUMENTS

| | | | | |
|---|---|---|---|---|
| 9,368,569 B1 * | 6/2016 | Leobandung | ..... | H01L 29/66795 |
| 2010/0295021 A1 * | 11/2010 | Chang | ................. | H01L 27/1203 257/24 |
| 2016/0155739 A1 * | 6/2016 | Ting | .................... | H01L 29/0653 257/401 |

* cited by examiner

*Primary Examiner* — Seahvosh Nikmanesh
(74) *Attorney, Agent, or Firm* — Wayne F. Reinke, Esq.; Heslin Rothenberg Farley & Mesiti P.C.

(57) ABSTRACT

A starting non-planar semiconductor structure is provided having a semiconductor substrate, raised semiconductor structures coupled to the substrate, and a layer of isolation material(s) surrounding the raised structures. The isolation layer is recessed to expose about 40 nm to about 70 nm of the raised structures. The increased height of the exposed raised structures, compared to conventional, allows for a taller gate and taller spacers, which reduces undercut under the spacers and short-channel effects from the loss of isolation material in fabrication.

9 Claims, 5 Drawing Sheets

US 9,735,152 B2

NON-PLANAR STRUCTURE WITH EXTENDED EXPOSED RAISED STRUCTURES AND SAME-LEVEL GATE AND SPACERS

BACKGROUND OF THE INVENTION

Technical Field

The present invention generally relates to non-planar semiconductor structures and the fabrication thereof. More particularly, the present invention relates to reducing spacer undercut and short-channel effects in non-planar semiconductor structures from loss of isolation material during fabrication.

Background Information

In the conventional fabrication of non-planar semiconductor devices, such as FinFETs (non-planar field-effect transistors with "fin" shaped raised structures), the isolation material surrounding the fins, for example, Shallow Trench Isolation (STI) material, the STI material is eaten away during various processes. In some cases, enough of the STI material is lost that under-cut occurs beneath the gate spacer, such that an electrical short is created. In addition, the STI loss may be enough that a cavity created for source/drain epitaxy may be too deep, inducing the short-channel effect.

Thus, a need exists to reduce the occurrence of under-cut beneath spacers and the short-channel effect from STI loss during non-planar semiconductor fabrication.

SUMMARY OF THE INVENTION

The shortcomings of the prior art are overcome and additional advantages are provided through the provision, in one aspect, of a method of reducing undercut under a spacer and short-channel effects from the loss of fin isolation material in the fabrication of a non-planar semiconductor structure. The method includes providing a starting non-planar semiconductor structure, the structure including a semiconductor substrate, a plurality of fins coupled to the substrate, and a layer of one or more isolation materials surrounding the fins. The method further includes recessing the isolation layer to expose a portion of each of the fins, the portion being about 40 nm to about 70 nm, within a precision of an instrument used for measuring the height.

In accordance with another aspect, a non-planar semiconductor structure is provided. The structure includes a semiconductor substrate and at least one fin coupled to the substrate. A layer of at least one isolation material surrounds a lower portion of the at least one fin, each fin of the at least one fin including a single continuous member, a height of an exposed portion of the at least one fin above the layer of at least one isolation material is about 40 nm to about 70 nm, within a precision of an instrument used for measuring the height, the non-planar semiconductor structure being part of a FinFET.

These, and other objects, features and advantages of this invention will become apparent from the following detailed description of the various aspects of the invention taken in conjunction with the accompanying drawings.

DETAILED DESCRIPTION OF THE INVENTION

Figure 1:
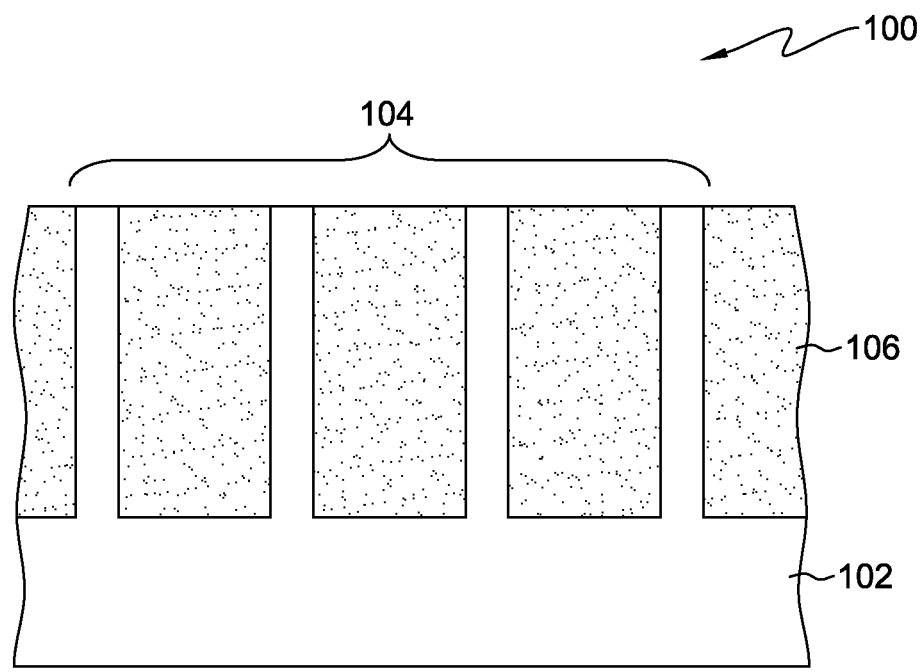
FIG. 1 is a cross-sectional view of one example of a starting non-planar semiconductor structure, the view taken along a semiconductor substrate at ends of the raised structures coupled to the substrate, the non-planar structure also including a layer of isolation material surrounding the raised structures, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting non-planar semiconductor structure 100, the view taken along a semiconductor substrate 102 at ends of the raised structures 104 coupled to the substrate, the non-planar structure also including a layer of isolation material 106 surrounding the raised structures, in accordance with one or more aspects of the present invention.

The starting structure may be conventionally fabricated, for example, using known processes and techniques. However, it will be understood that the fabrication of the starting structure forms no part of the present invention. Further, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the raised structures 104 may take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type.

The layer 106 of isolation material may include, for example, an oxide. In one particular example, the oxide may include a flowable oxide.

Figure 2:
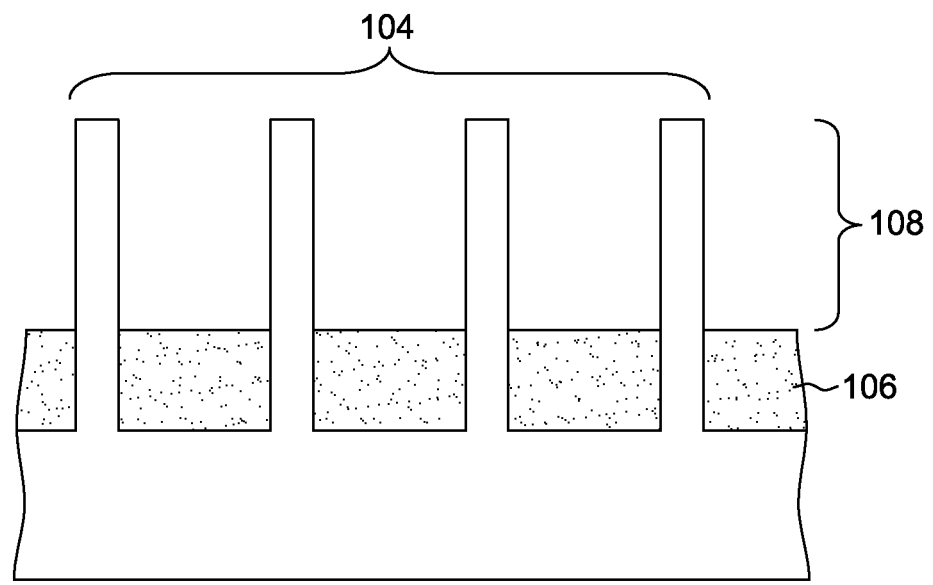
FIG. 2 depicts the structure of FIG. 1 after recessing the layer of isolation material to expose a larger-than-conventional portion of the raised structures, in accordance with one or more aspects of the present invention.

FIG. 2 depicts the structure of FIG. 1 after recessing the layer 106 of isolation material to expose a larger-than-conventional portion 108 of the raised structures 104, in accordance with one or more aspects of the present invention. The exposed portion of the raised structures is above about 40 nm to about 70 nm, as compared to a conventional size of about 30 nm to about 40 nm. The recessing may be accomplished, for example, using a dry etch process, e.g., SiCoNi etch process, using a chemical oxide removal process (COR), or using a hydrofluoric acid (HF) dip. Other types of etches may also be appropriate.

Figure 3:
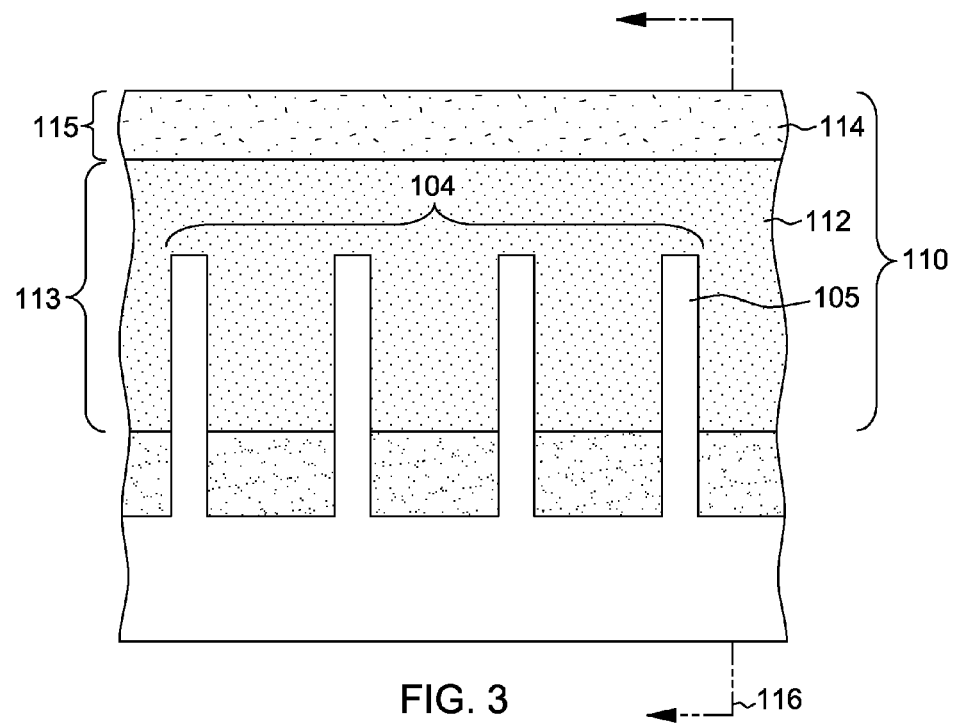
FIG. 3 depicts the structure of FIG. 2 after creation of dummy gates, the dummy gates including a layer of a dummy gate material encompassing the raised structures, and a layer or cap of protective material thereover, in accordance with one or more aspects of the present invention.

FIG. 3 depicts the structure of FIG. 2 after creation of dummy gate structures 110 (see FIG. 4 view), the dummy gate structures each including a layer of a dummy gate material 112 encompassing the raised structures 104 (e.g., raised structure 105), and a layer or cap 114 of protective material thereover, in accordance with one or more aspects of the present invention. The dummy gate material may include, for example, polycrystalline silicon (aka polysilicon), and the layer or cap 114 of protective material may be, for example, a nitride (e.g., silicon nitride). Creating the layer of dummy gate material may be accomplished, for example, using one or more conventional processes, e.g., using a chemical vapor deposition (CVD) process. Creating the layer of protective material on the dummy gate material may be accomplished, for example, using one or more conventional processes, e.g., Low-Pressure CVD (LPCVD). In one example, where the dummy gate material includes polysilicon, a height 113 of the polysilicon may be about 80 nm to about 300 nm. In another example, where the layer 114 of protective material includes a nitride (e.g., silicon nitride), a thickness of the nitride layer may be about 10 nm to about 60 nm.

Figure 4:
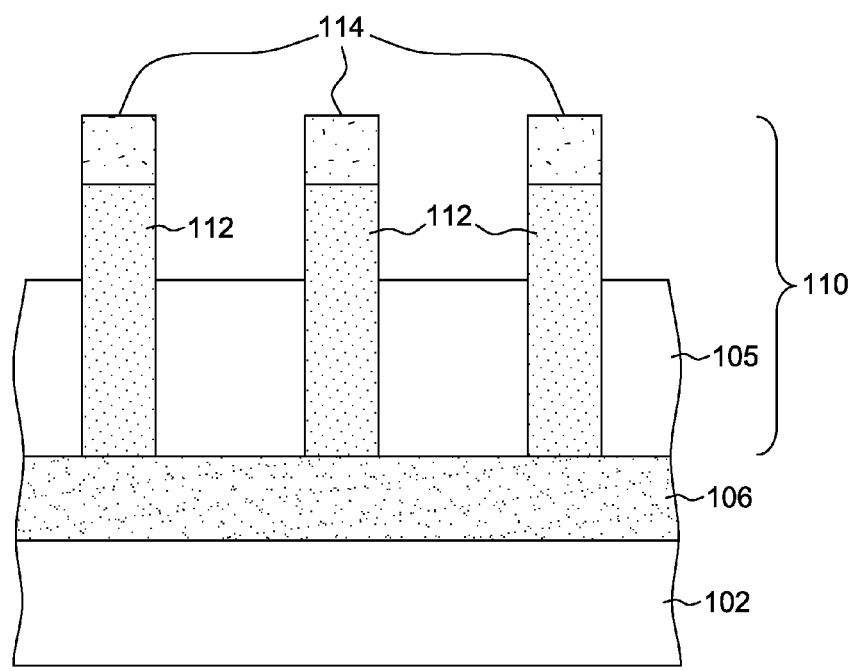
FIG. 4 is an alternate cross-sectional view of the structure of FIG. 3 taken across the substrate in front and along a length of a raised structure, in accordance with one or more aspects of the present invention.

FIG. 4 is an alternate cross-sectional view of the structure of FIG. 3 taken across the substrate 102 in front and along a length of a raised structure 105 (e.g., along line 116, FIG. 3), in accordance with one or more aspects of the present invention.

Figure 5:
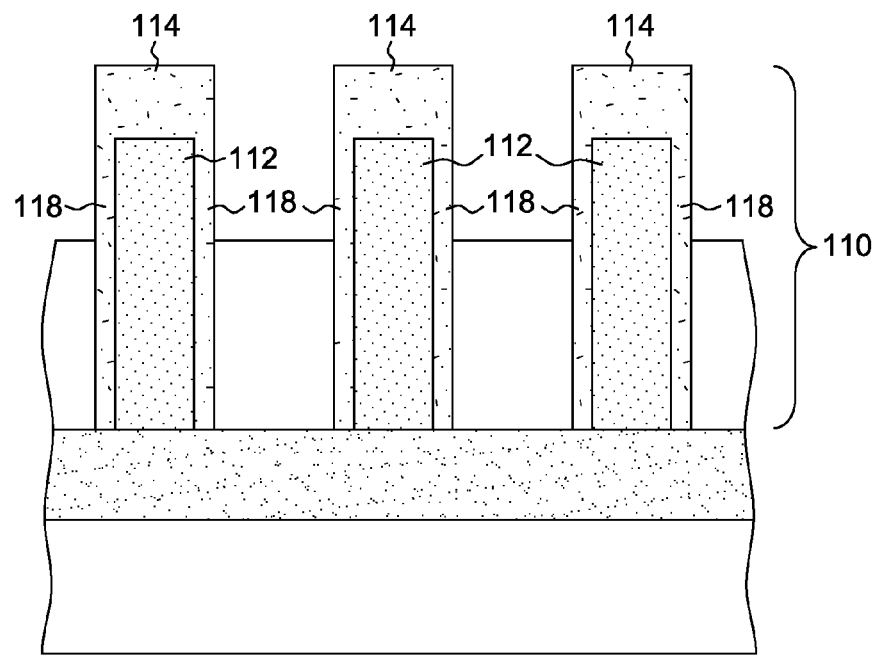
FIG. 5 depicts the structure of FIG. 4 after creation of spacers on either side of the dummy gates, in accordance with one or more aspects of the present invention.

FIG. 5 depicts the structure of FIG. 4 after creation of spacers 118 on both sides of each of the dummy gates 110, in accordance with one or more aspects of the present invention. The spacers may include, for example, a nitride (e.g., silicon nitride), and may be a same material as the layer or cap 114 of protective material. Creation of the spacers may be accomplished by, for example, using one or more conventional processes, e.g., CVD.

Figure 6:
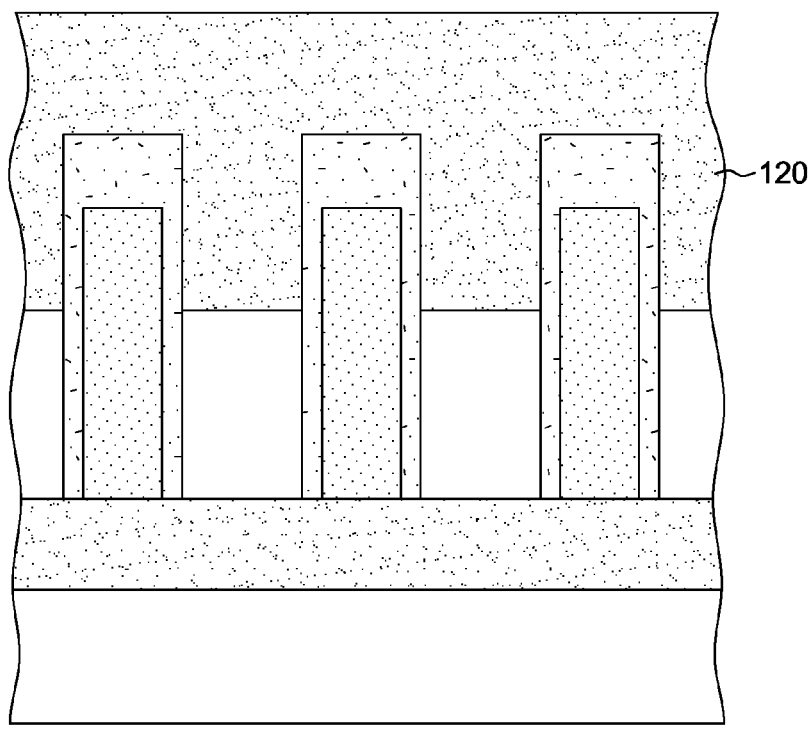
FIG. 6 depicts the structure of FIG. 5 after creation of a blanket layer of a dielectric material over the non-planar structure, in accordance with one or more aspects of the present invention.

FIG. 6 depicts the structure of FIG. 5 after creation of a blanket layer 120 of a dielectric material over the non-planar structure 100, in accordance with one or more aspects of the present invention. The material(s) of the blanket layer may include, for example, an oxide (e.g., a flowable oxide), and may be created, for example, using one or more conventional processes, e.g., CVD, a high-aspect-ratio process (HARP) or other spin-on processes.

Figure 7:
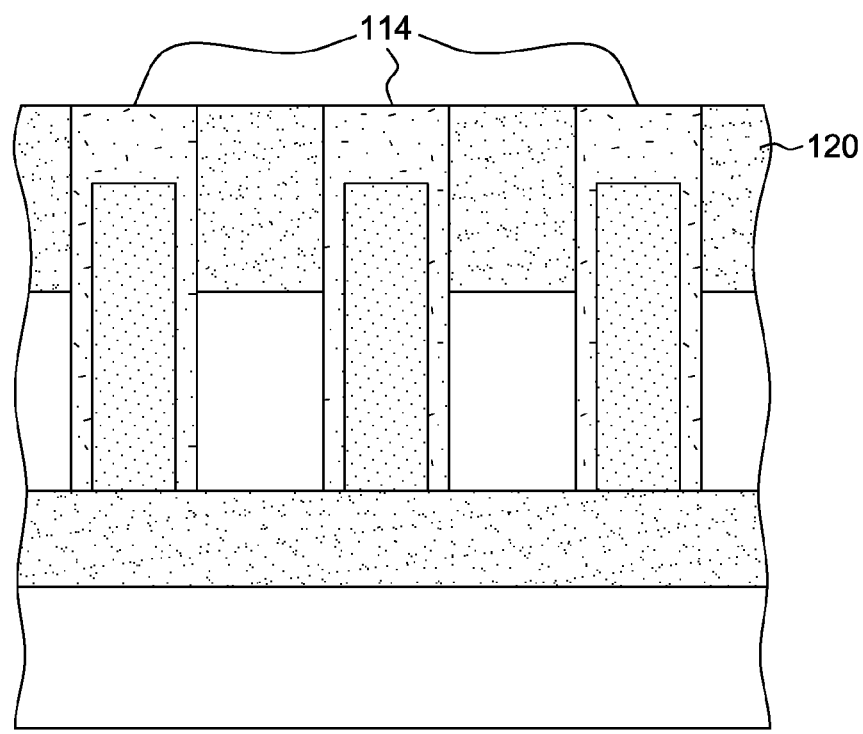
FIG. 7 depicts the structure of FIG. 6 after planarization of the blanket layer of dielectric material, in accordance with one or more aspects of the present invention.

FIG. 7 depicts the structure of FIG. 6 after planarization of the blanket layer 120 of dielectric material, in accordance with one or more aspects of the present invention. Planarization of the blanket layer may be accomplished by, for example, using a chemical-mechanical polish (CMP) process. In one example, where the layer or cap 114 of protective material includes a nitride (e.g., silicon nitride), the protective material may be used as a stop for the CMP process.

Figure 8:
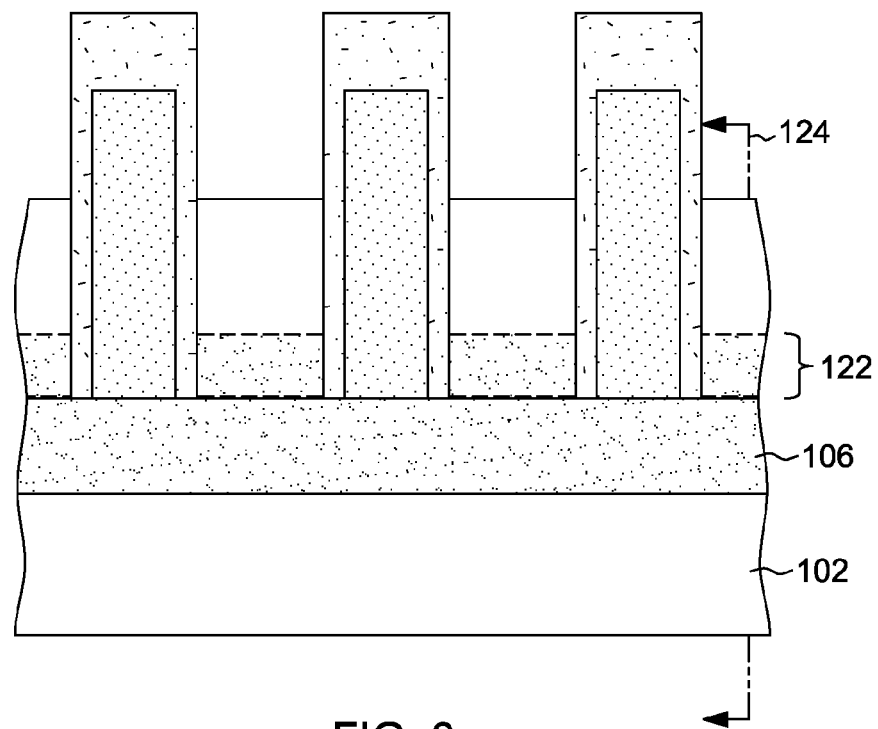
FIG. 8 depicts the structure of FIG. 7 after removal of the remainder of the blanket layer of dielectric material, and showing a higher height the isolation material would have under conventional fabrication, in accordance with one or more aspects of the present invention.
Figure 10:
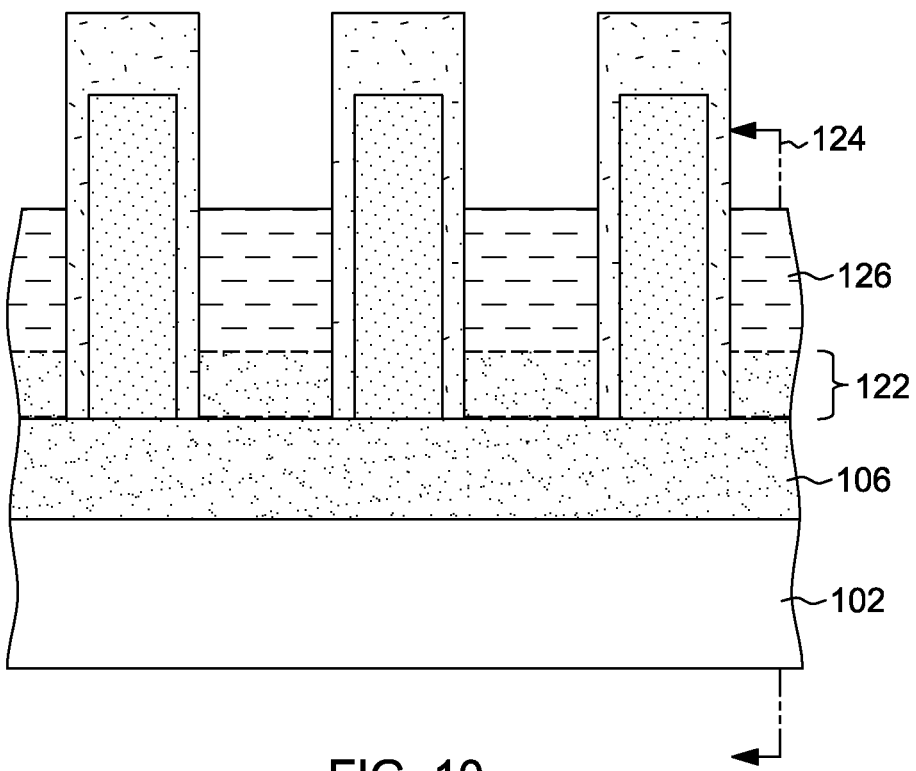
FIG. 10 depicts one example of the structure of FIG. 8 after optionally creating epitaxy on the raised structures, in accordance with one or more aspects of the present invention.

FIG. 8 depicts the structure of FIG. 7 after removal of the remainder of the blanket layer (120, FIG. 7) of dielectric material, in accordance with one or more aspects of the present invention, and showing an additional height 122 the isolation material 106 would have under conventional fabrication. Of course, this region is actually exposed raised structure. Where epitaxial material is included on the raised structures, the height difference can be viewed as the optimal gate width (e.g., up to about 30 nm) over a depth of epitaxial material. FIG. 10 depicts one example of the structure of FIG. 8 after optionally creating epitaxy 126 on the raised structures. Where one or more of the raised structures 104 are associated with a p-type device, the epitaxy may include, for example, silicon germanium (SiGe). Where one or more of the raised structures 104 are associated with a n-type device, the epitaxy may include, for example, phosphorus-doped silicon (SiP). In one example, the epitaxy may be created by growing it on recessed portions of the raised structures. In another example, the epitaxy may be grown around a top portion of the existing raised structures using a cladding process.

Figure 9:
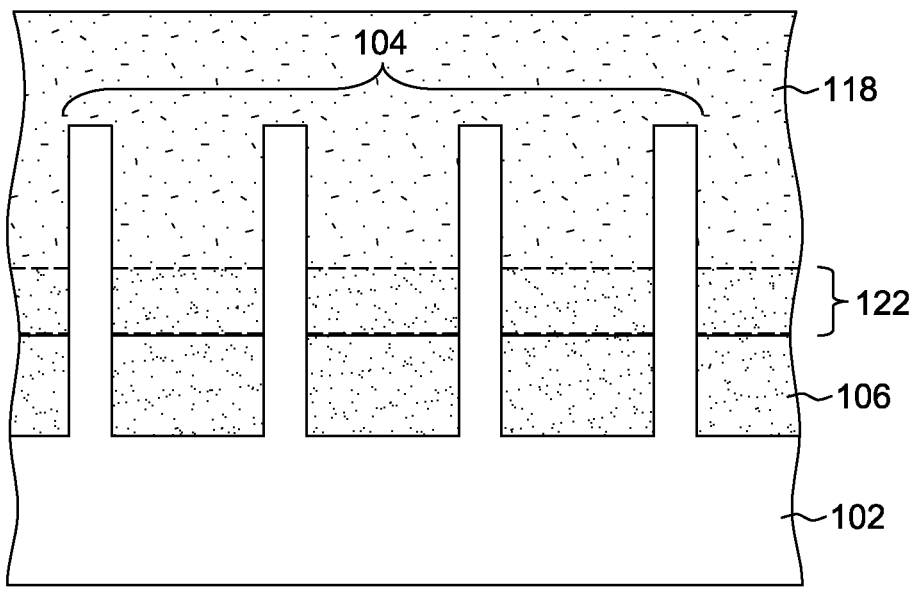
FIG. 9 is an alternate view of the structure of FIG. 8 similar to that of FIGS. 1-3, in accordance with one or more aspects of the present invention.

FIG. 9 is an alternate view of the structure of FIG. 8 similar to that of FIGS. 1-3 (124, FIG. 8), in accordance with one or more aspects of the present invention.

In a first aspect, disclosed above is a method of reducing undercut beneath spacers and short-channel effects from a loss of raised structure isolation material during the fabrication of a non-planar structure. The method includes, for example, providing a starting non-planar semiconductor structure, the structure including a semiconductor substrate, a plurality of raised semiconductor structures coupled to the substrate, and a layer of isolation material(s) surrounding the raised structures. The method further includes recessing the isolation layer to expose a portion of the raised structures, the portion being about 40 nm to about 70 nm.

The method of the first aspect may further include, for example, creating gate structure(s) encompassing part of the exposed portion of the raised structure(s).

In one example, the method may further include creating a layer of at least one protective material on the gate structure(s). The method may further include, for example, creating spacers on both sides of the gate structure(s), a bottom of the spacers being situated at a same level of the non-planar structure as a bottom of the gate structure(s). In one example, the spacers may include a same material as the layer of protective material on the gate structure(s).

In one example, the gate structure may include, for example, a dummy gate structure of at least one dummy gate material.

In a second aspect, disclosed above is a non-planar semiconductor structure. The structure includes a semiconductor substrate and at least one raised semiconductor structure coupled to the substrate. A layer of at least one isolation material surrounds a lower portion of the at least one raised structure, and a height of an exposed portion of the at least one raised structure above the layer of at least one isolation material is about 40 nm to about 70 nm.

The structure of the second aspect may include, for example, gate structure(s) encompassing the exposed portion of the raised structure(s).

In one example, the structure may further include a layer of protective material on the gate structure(s). The structure may further include spacers on both sides of the gate structure(s), a bottom of the spacers being situated at a same level of the non-planar semiconductor structure as a bottom of the gate structure(s). In one example, the spacers may include a same material as the layer of protective material on the gate structure(s).

In one example, the gate structure(s) may further include, for example, dummy gate structure(s) of at least one dummy gate material.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A non-planar semiconductor structure, comprising:
   a semiconductor substrate; and
   at least one fin coupled to the substrate, wherein a layer of at least one isolation material surrounds a lower portion of the at least one fin, wherein each fin of the at least one fin comprises a single continuous member, wherein a height of an exposed portion of the at least one fin above the layer of at least one isolation material is about 40 nm to about 70 nm, within a precision of an instrument used for measuring the height, and wherein the non-planar semiconductor structure is part of a FinFET.

2. The non-planar structure of claim 1, further comprising at least one gate structure encompassing part of the exposed portion of the at least one fin.

3. The non-planar structure of claim 2, further comprising a layer of at least one protective material on the at least one gate structure.

4. The non-planar structure of claim 3, further comprising spacers on both sides of the at least one gate structure, a bottom of the spacers being situated at a same level of the non-planar semiconductor structure as a bottom of the at least one gate structure.

5. The non-planar structure of claim 4, wherein the spacers comprise a same material as the layer of at least one protective material on the at least one gate structure.

6. The non-planar structure of claim 2, wherein the at least one gate structure comprises at least one dummy gate structure of at least one dummy gate material.

7. The non-planar semiconductor structure of claim 1, wherein the one or more materials comprise one or more of silicon (Si), single crystal silicon, polycrystalline Si, amorphous Si, silicon-on-nothing (SON), silicon-on-insulator (SOI) or silicon-on-replacement insulator (SRI) and silicon germanium.

8. The non-planar semiconductor structure of claim 1, wherein the semiconductor substrate comprises one or more of silicon (Si), single crystal silicon, polycrystalline Si, amorphous Si, silicon-on-nothing (SON), silicon-on-insulator (SOI), silicon-on-replacement insulator (SRI), silicon germanium, germanium (Ge) in crystal, a compound semiconductor, such as silicon carbide (SiC), gallium arsenide (GaAs), gallium phosphide (GaP), indium phosphide (InP), indium arsenide (InAs), indium antimonide (InSb), one or more combinations thereof, GaAsP, AlInAs, GaInAs, GaInP, GaInAsP and one or more combinations thereof.

9. The non-planar semiconductor structure of claim 1, wherein the semiconductor substrate comprises a bulk semiconductor substrate, and wherein the at least one fin is etched from the bulk semiconductor substrate.

* * * * *